United States Patent
Ikeuchi et al.

(10) Patent No.: US 12,432,847 B2
(45) Date of Patent: Sep. 30, 2025

(54) CIRCUIT ELEMENT

(71) Applicant: KABUSHIKI KAISHA TOSHIBA, Tokyo (JP)

(72) Inventors: Hiroaki Ikeuchi, Yokohama Kanagawa (JP); Keiichi Yamaguchi, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 305 days.

(21) Appl. No.: 18/172,997

(22) Filed: Feb. 22, 2023

(65) Prior Publication Data

US 2024/0080968 A1  Mar. 7, 2024

(30) Foreign Application Priority Data

Sep. 5, 2022 (JP) ................. 2022-140941

(51) Int. Cl.
| | |
|---|---|
| H05K 1/18 | (2006.01) |
| H01G 4/12 | (2006.01) |
| H01G 4/33 | (2006.01) |
| H01L 23/66 | (2006.01) |
| H05K 1/02 | (2006.01) |
| H05K 1/11 | (2006.01) |

(52) U.S. Cl.
CPC ............ H05K 1/0243 (2013.01); H01G 4/12 (2013.01); H01G 4/33 (2013.01); H01L 23/66 (2013.01); H05K 1/111 (2013.01); H05K 1/181 (2013.01)

(58) Field of Classification Search
CPC ...... H05K 1/0243; H05K 1/111; H05K 1/181; H01G 4/12; H01G 4/33; H01L 23/66
USPC ........................................... 361/760
See application file for complete search history.

(56) References Cited

U.S. PATENT DOCUMENTS

| | | | | |
|---|---|---|---|---|
| 2011/0180811 A1* | 7/2011 | Suzuki | ............. | H01L 24/17 |
| | | | | 257/77 |
| 2015/0171033 A1* | 6/2015 | Seler | ............. | H01L 23/5389 |
| | | | | 257/664 |
| 2016/0293334 A1* | 10/2016 | Ehara | ............. | H01G 4/306 |
| 2019/0096579 A1* | 3/2019 | Takeoka | ............. | H01G 4/33 |

FOREIGN PATENT DOCUMENTS

| | | |
|---|---|---|
| JP | 2016-195161 A | 11/2016 |
| JP | 6697676 B2 | 5/2020 |

\* cited by examiner

*Primary Examiner* — Binh B Tran
(74) *Attorney, Agent, or Firm* — Finnegan, Henderson, Farabow, Garrett & Dunner, LLP

(57) ABSTRACT

According to one embodiment, a circuit element includes a silicon substrate, a lower electrode, a dielectric film, and an upper electrode. The lower electrode is formed on a major surface of the silicon substrate by a doping process. The dielectric film is formed on the lower electrode. The upper electrode is formed on the dielectric film. The upper electrode includes a slit.

18 Claims, 11 Drawing Sheets

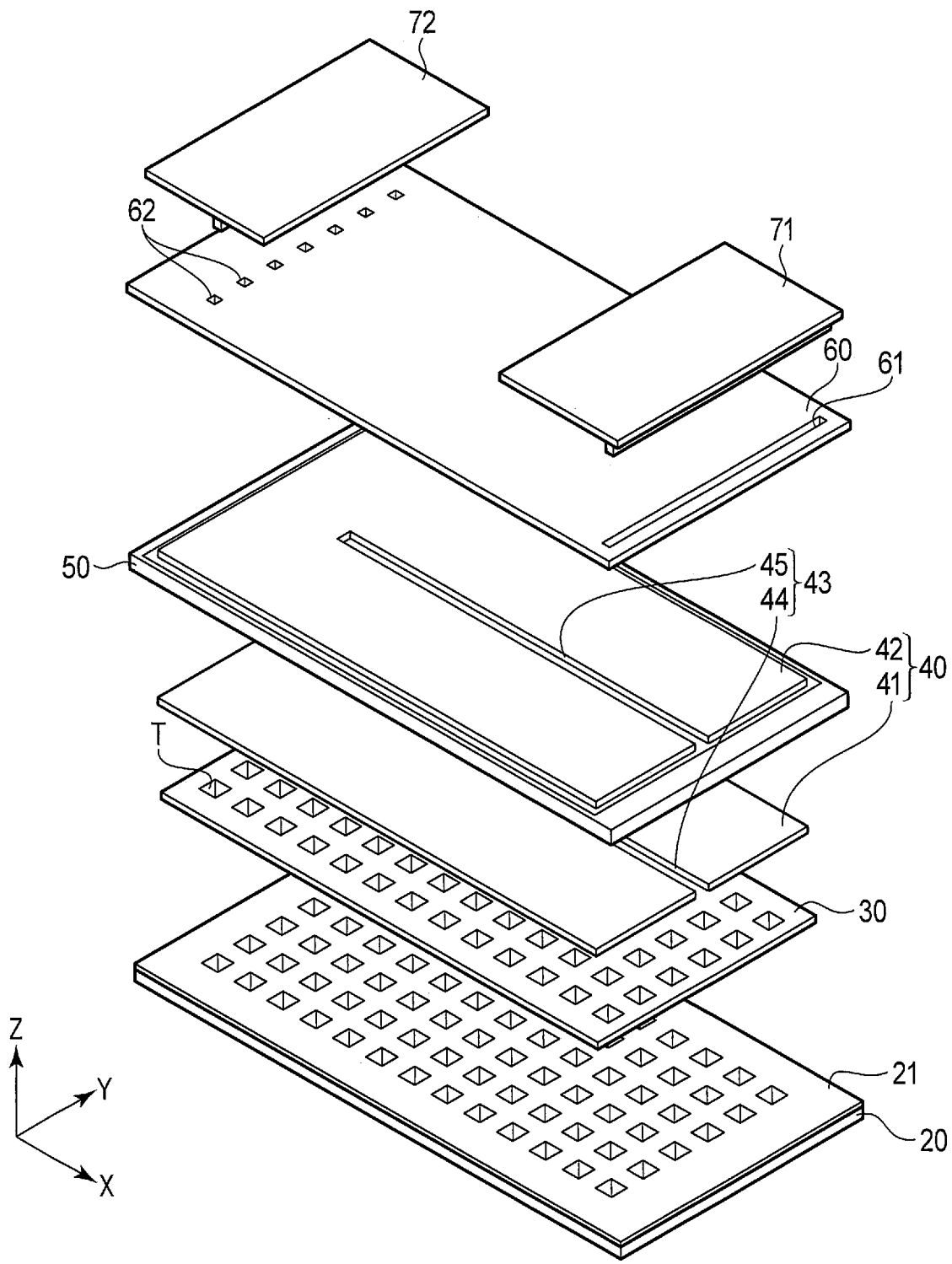
F I G. 1

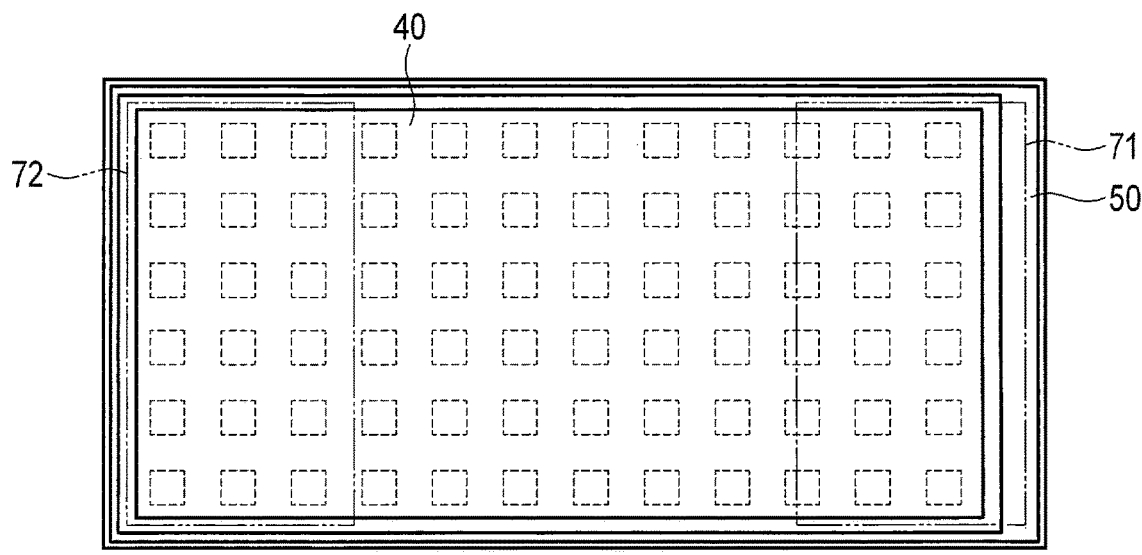
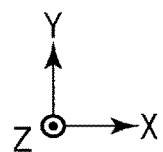
F I G. 5
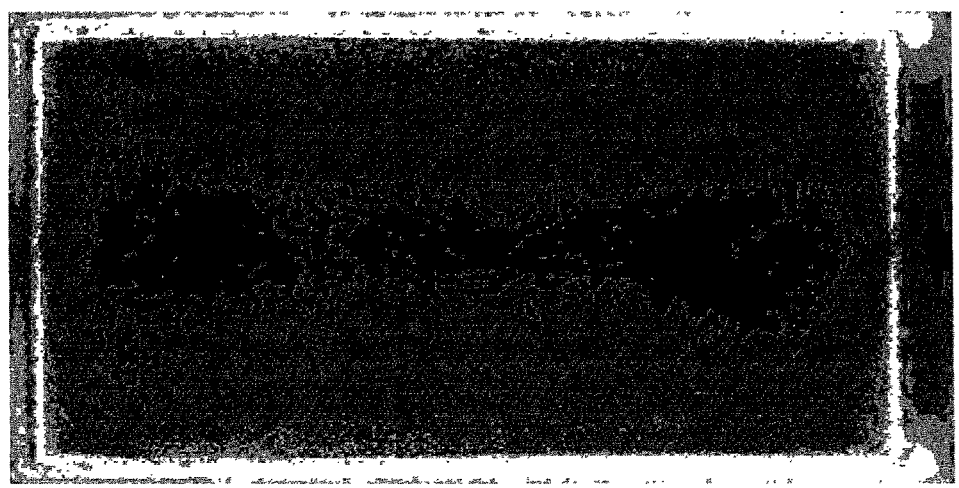
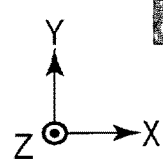
F I G. 6

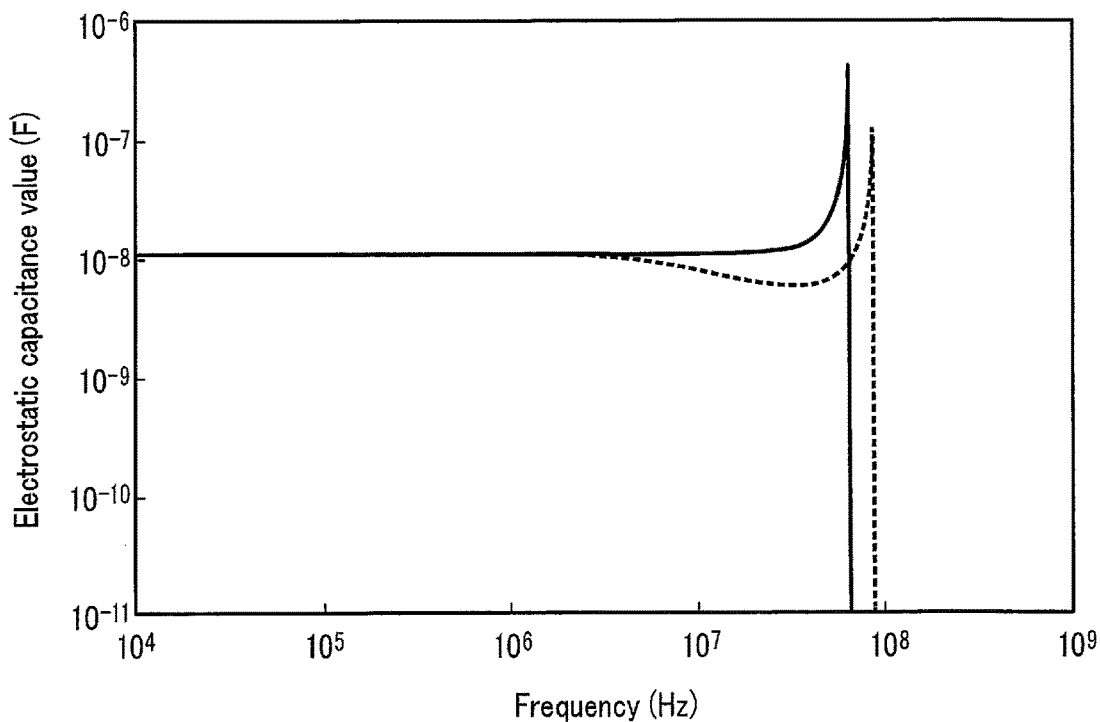
F I G. 7
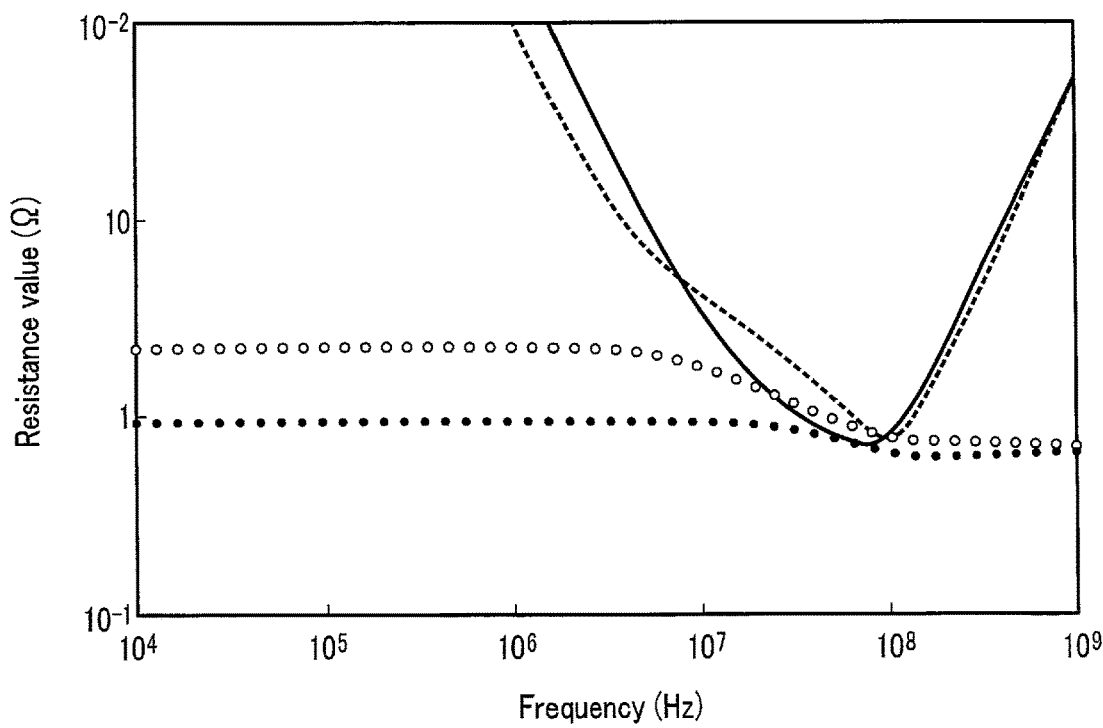
F I G. 8

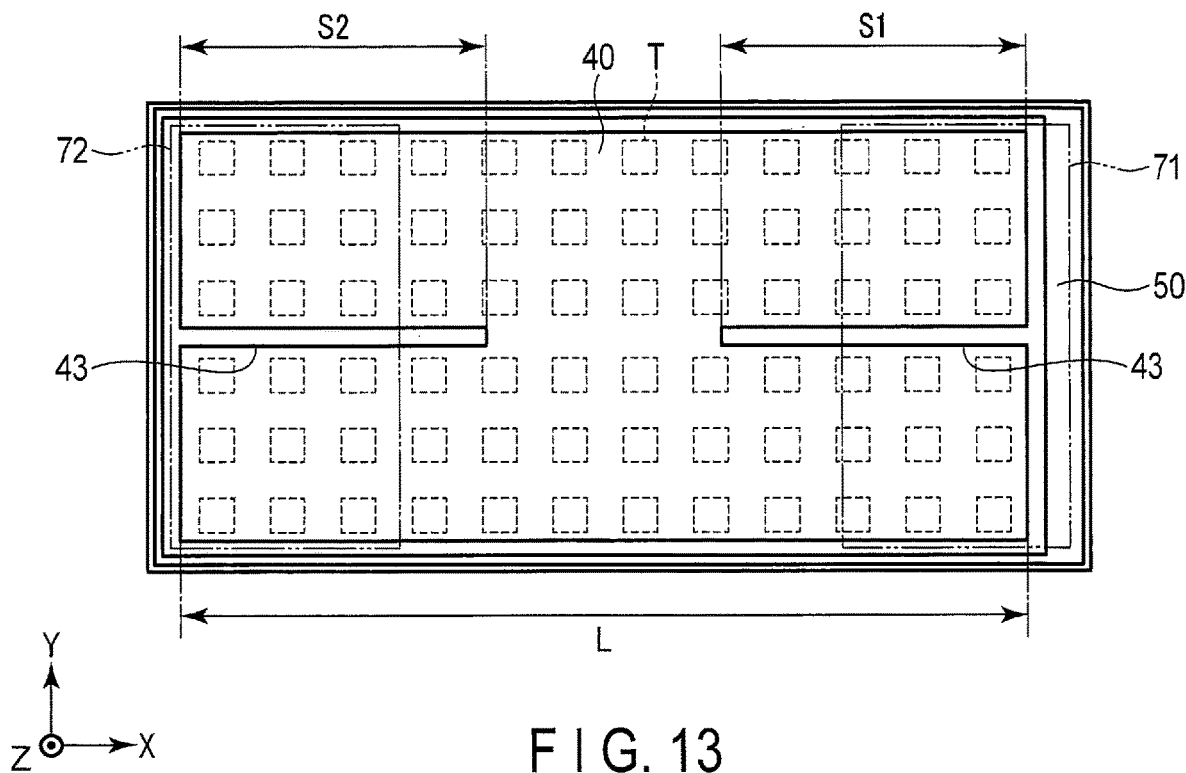
F I G. 13
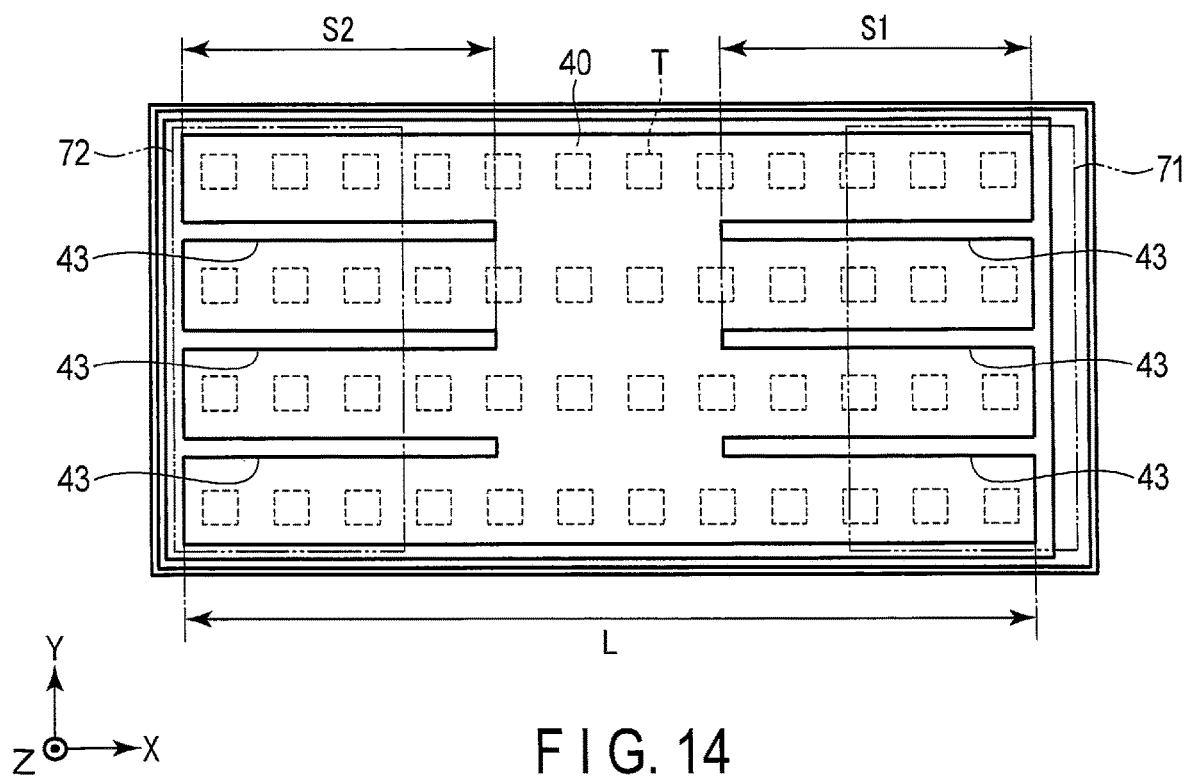
F I G. 14

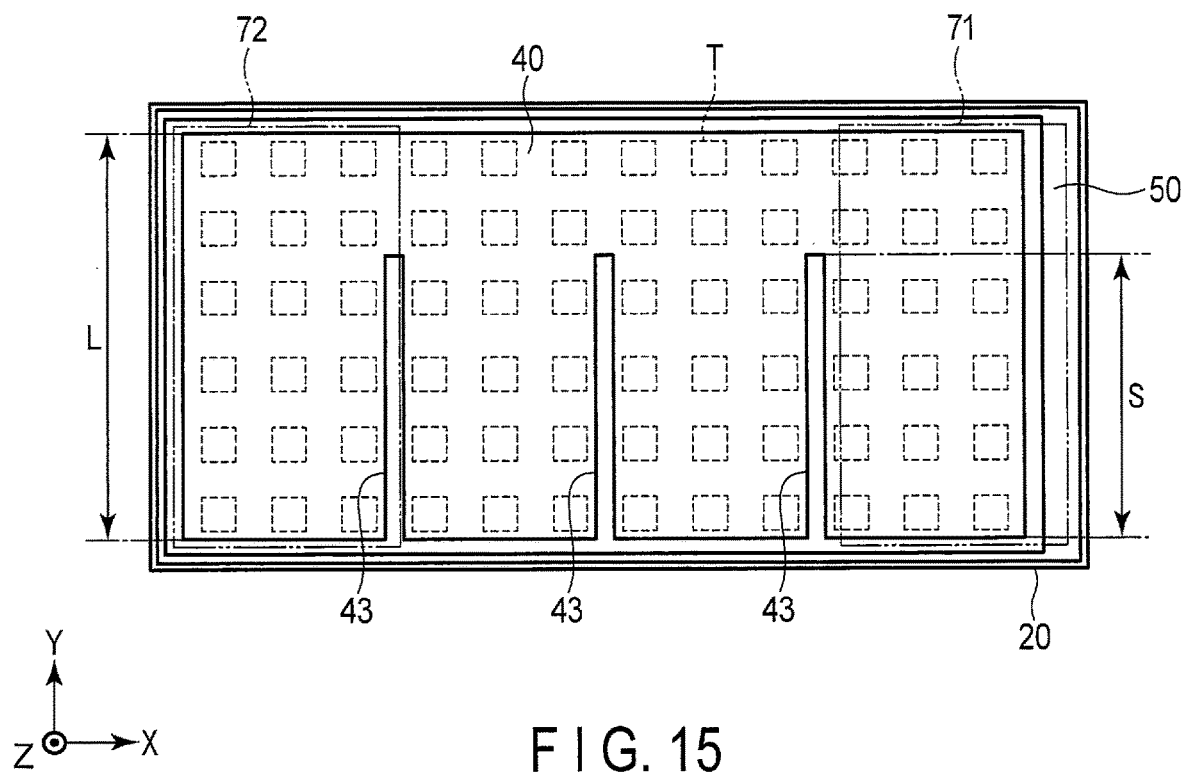
F I G. 15
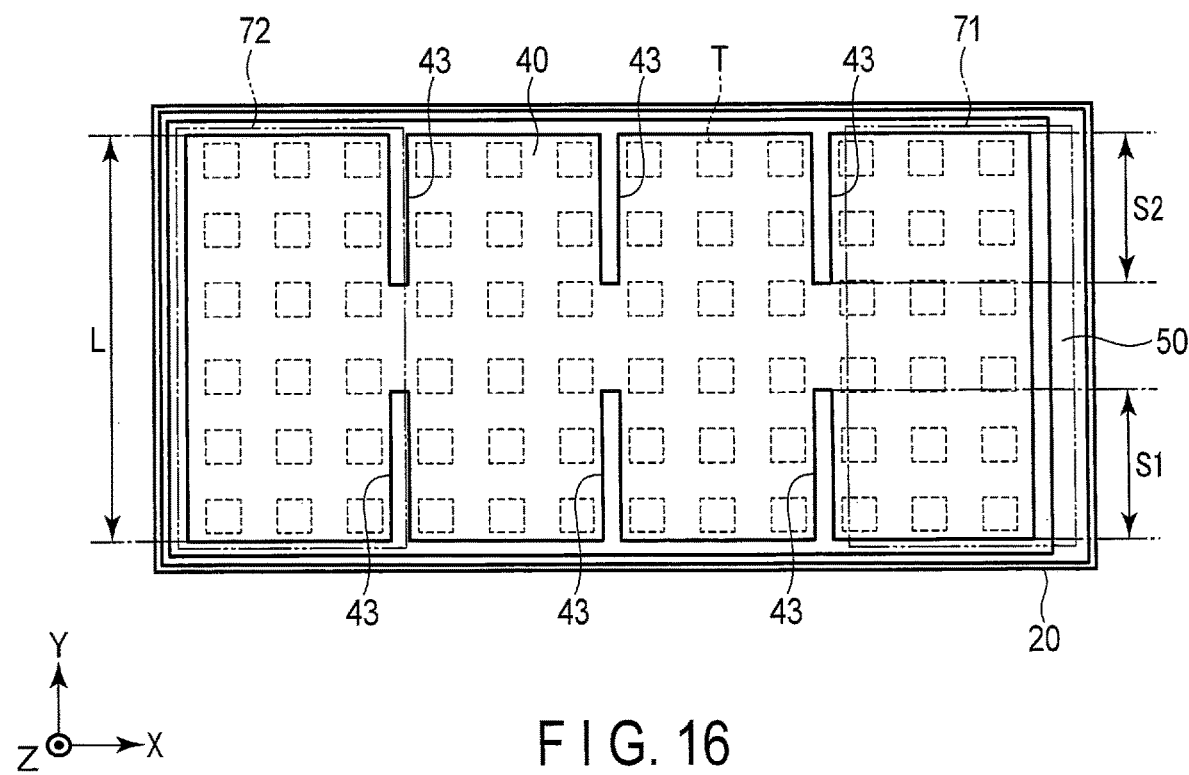
F I G. 16

CIRCUIT ELEMENT

CROSS-REFERENCE TO RELATED APPLICATIONS

This application is based upon and claims the benefit of priority from Japanese Patent Application No. 2022-140941, filed Sep. 5, 2022; the entire contents of which are incorporated herein by reference.

FIELD

Embodiments of the present invention relate generally to a circuit element.

BACKGROUND

A circuit element, for example, a silicon capacitor or a silicon condenser, has such an advantage that an electrostatic capacitance per unit area can be increased by enlarging a surface area by using a semiconductor process, and a large capacitance can be achieved.

On the other hand, the silicon capacitor, compared to a stacked ceramic capacitor, has such a disadvantage that a decrease in capacitance occurs in a high-frequency region.

BRIEF DESCRIPTION OF THE DRAWINGS

FIG. 1 is an exploded perspective view schematically illustrating a structure of a circuit element according to a first embodiment.

FIG. 5 is a plan view illustrating a shape of an internal electrode of a circuit element according to a comparative example.

FIG. 6 is a view illustrating a current density distribution in a lower electrode of the circuit element including the internal electrode having the shape illustrated in FIG. 5.

FIG. 7 is a graph showing frequency characteristics of electrostatic capacitance values of capacitors in the circuit element according to the first embodiment and the circuit element according to the comparative example.

FIG. 8 is a graph showing frequency characteristics of impedances and equivalent series resistances of the capacitors in the circuit element according to the first embodiment and the circuit element according to the comparative example.

FIG. 13 is a plan view illustrating a shape of an internal electrode of a circuit element according to Modification 4 of the first embodiment.

FIG. 14 is a plan view illustrating a shape of an internal electrode of a circuit element according to Modification 5 of the first embodiment.

FIG. 15 is a plan view illustrating a shape of an internal electrode of a circuit element according to Modification 6 of the first embodiment.

FIG. 16 is a plan view illustrating a shape of an internal electrode of a circuit element according to Modification 7 of the first embodiment.

DETAILED DESCRIPTION

According to one embodiment, a circuit element includes a silicon substrate, a lower electrode, a dielectric film, and an upper electrode. The lower electrode is formed on a major surface of the silicon substrate by a doping process. The dielectric film is formed on the lower electrode. The upper electrode is formed on the dielectric film. The upper electrode includes a slit.

According to another embodiment, a circuit element includes a silicon substrate, a lower electrode, a dielectric film, and a plurality of upper electrodes. The lower electrode is formed on a major surface of the silicon substrate by a doping process. The dielectric film is formed on the lower electrode. The plurality of upper electrodes is formed on the dielectric film. The upper electrodes are spaced apart from each other.

Hereinafter, embodiments according to the present invention are described with reference to the accompanying drawings.

First Embodiment

Figure 2:
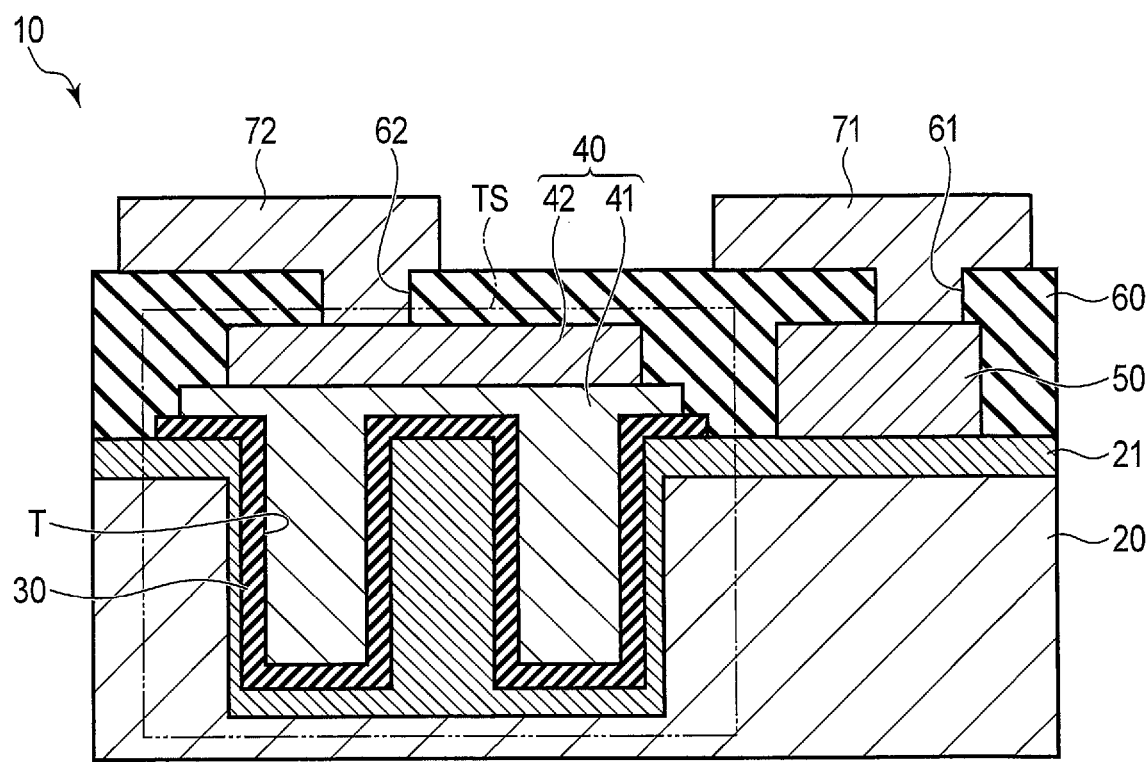
FIG. 2 is a cross-sectional view schematically illustrating a cross-sectional structure of the circuit element of FIG. 1.

To begin with, referring to FIG. 1 and FIG. 2, a structure of a circuit element according to a first embodiment is described. FIG. 1 is an exploded perspective view schematically illustrating a structure of a circuit element 10 according to the first embodiment. FIG. 2 is a cross-sectional view schematically illustrating a cross-sectional structure of the circuit element of FIG. 1. The circuit element 10 is, for example, a silicon capacitor or a silicon condenser.

The circuit element 10 includes a silicon substrate 20, a lower electrode 21, a dielectric film 30, an internal electrode 40, an external electrode 50, an insulation layer 60, a first pad 71 and a second pad 72.

The circuit element 10 is a stacked structure in which the lower electrode 21, dielectric film 30, internal electrode 40, external electrode 50, insulation layer 60, first pad 71 and second pad 72 are formed on the silicon substrate 20 by using a semiconductor process.

The silicon substrate 20 has a parallelepipedic shape. Hereinafter, that surface of the surfaces of the parallelepiped, which is largest and is illustrated on the upper side in FIG. 1, is referred to as "major surface". The lower electrode 21, the dielectric film 30, a conductive layer 41, the internal electrode 40, the external electrode 50, the insulation layer 60, the first pad 71 and the second pad 72 are formed on the major surface of the silicon substrate 20.

In addition, the terms "upper", "lower", "left", "right", "front" and "rear" are used based on the illustration in FIG. 1. In other words, in the XYZ orthogonal coordinate system illustrated in FIG. 1, a +Z direction is referred to as "upper", a −Z direction as "lower, a +X direction as "right", a −X direction as "left", a +Y direction as "rear", and a −Y direction as "front".

Specifically, the silicon substrate 20 has a planar parallelepipedic shape that is elongated in the left-and-right direction, i.e., in the X direction. The major surface of the silicon substrate is an upper-side surface that is parallel to an XY plane.

The lower electrode 21 is formed over the entirety of the major surface of the silicon substrate 20. The lower electrode 21 is a layer having a resistance value that is lowered by a doping process on the major surface of the silicon substrate 20.

The dielectric film 30 is formed on the lower electrode 21, excluding a portion of the lower electrode 21. Specifically, the dielectric film 30 is formed on the lower electrode 21, excluding a peripheral portion of the lower electrode 21. For example, for an electric connection to the first pad 71 to be described later, the dielectric film 30 is formed on the lower electrode 21, with one end portion thereof in the left-and-right direction, i.e., in the X direction, which is a right end portion in FIG. 1, being provided with a relative large space. For example, the dielectric film 30 is formed of silicon nitride. Examples of the material used for the dielectric film 30 include other ordinary oxide films and nitride films. Besides, a material of a high-dielectric-constant material, such as hafnium oxide, may be used.

The internal electrode 40 is formed on the dielectric film 30. The internal electrode 40 is opposed to the lower electrode 21, with the dielectric film 30 being interposed. The lower electrode 21, dielectric film 30 and internal electrode 40 are capacitor structural parts of the circuit element 10.

As illustrated in FIG. 2, the capacitor structural parts of the circuit element 10, i.e., the lower electrode 21, dielectric film 30 and internal electrode 40, include a trench structure TS. Specifically, the stacked structure of the silicon substrate 20, lower electrode 21 and dielectric film 30 includes a plurality of trenches T. For example, each trench T is a rectangular groove. The trench T may have such a structure as to have a greater surface area, aside from the rectangular groove (the shape of the groove is a quadratic prism). For example, the shape of the groove may be a circular cylinder, an elliptic cylinder or a polygonal column. The internal electrode 40 fills the trenches T. An upper surface of the internal electrode 40 is flat.

The internal electrode 40 includes a conductive layer 41 that fills the trenches T, and an upper electrode 42 formed on the conductive layer 41.

The conductive layer 41 fills the trenches T. An upper surface of the conductive layer 41 is flat. For example, the conductive layer 41 is formed of polysilicon. In addition, the conductive layer 41 is formed of polysilicon of a two-layer structure.

The upper electrode 42 is formed on the conductive layer 41. In other words, the conductive layer 41 is interposed between the dielectric film 30 and the upper electrode 42.

For example, the upper electrode 42 is formed of aluminum. Aside from aluminum, a material with a predetermined conductivity or more is usable for the upper electrode 42. For example, the upper electrode 42 may be formed of gold, silver, copper, aluminum, or an alloy thereof.

For example, the trench structure TS is formed in the following manner. To begin with, a plurality of grooves is formed in the major surface of the silicon substrate 20. Then, the lower electrode 21 and dielectric film 30 are successively formed on the major surface of the silicon substrate 20, and thereby a plurality of trenches T are formed. Subsequently, the conductive layer 41 is formed on the dielectric film 30, thereby filling the trenches T with the conductive layer 41. Further, the upper electrode 42 is formed on the conductive layer 41. Note that the method of forming the grooves is freely chosen. For example, the grooves may be formed by a MacEtch (Metal-assisted Chemical Etching) method. The MacEtch method is a method of forming grooves by etching a silicon substrate, on a surface of which a pattern of a metal catalyst is formed.

By forming the capacitor structural parts of the circuit element 10 as the trench structure TS, compared to a planar structure, the surface area of the dielectric film 30 can remarkably be increased. Thereby, the circuit element 10 including a capacitor of a large capacitance can be constructed.

As illustrated in FIG. 1, the outer shape of the internal electrode 40 is a rectangular shape with a long side extending in the left-and-right direction, i.e., along the X axis. Here, the outer shape of the internal electrode 40 refers to a shape formed by connecting outer sides of the internal electrode 40 in a projection onto an XY plane. Similarly, the outer shape of each of the conductive layer 41 and upper electrode 42, which constitute the internal electrode 40, is a rectangular shape with a long side extending in the left-and-right direction, i.e., along the X axis.

The internal electrode 40 includes one elongated rectangular slit 43. Thus, each of the conductive layer 41 and upper electrode 42, which constitute the internal electrode 40, also includes one elongated rectangular slit 44, 45. The slits 44 and 45 constitute the slit 43. Here, the term "elongated rectangular" refers to a rectangular shape in which the ratio of a long side to a short side is 8 or more. The slit 43 extends along a side of the rectangle that is the outer shape of the internal electrode 40. In the example of FIG. 1, the slit 43 extends along a long side of the outer shape of the internal electrode 40. Specifically, the slit 43 extends in the left direction, i.e., in the −X direction, from the right side of the internal electrode 40. Furthermore, the slit 43 passes through the center of the outer shape of the internal electrode 40.

The external electrode 50 is formed on the lower electrode 21 around the internal electrode 40 at a distance from the internal electrode 40. The outer shape of the external electrode 50 is a rectangular shape with a long side extending in the left-and-right direction, i.e., along the X axis. In other words, the external electrode 50 has a rectangular frame shape. For example, for an electric connection to the first pad 71 to be described later, the external electrode 50 includes a large-width end portion on one side in the left-and-right direction, i.e., in the X direction, which is a right end portion in FIG. 1.

For example, the external electrode 50 is formed of aluminum, like the upper electrode 42. For example, the upper electrode 42 and external electrode 50 are formed by the same steps of the semiconductor process, i.e., by aluminum film formation and etching. Aside from aluminum, a material with a predetermined conductivity or more is usable for the external electrode 50. For example, the external electrode 50 may be formed of gold, silver, copper, aluminum, or an alloy thereof.

As illustrated in FIG. 2, the insulation layer 60 is formed on the lower electrode 21, dielectric film 30, internal electrode 40 and external electrode 50. The insulation layer 60 includes a first via-hole 61 that exposes the lower electrode 21, and a plurality of second via-holes 62 that expose the upper electrode 42. For example, the first via-hole 61 is a through-hole having an elongated shape in the front-and-rear direction, and the second via-holes 62 are rectangular through-holes aligned in the front-and-rear direction. The first via-hole 61 is formed on the right side of the insulation layer 60, i.e., on the +X side, and the second via-holes 62 are formed on the left side of the insulation layer 60, i.e., on the −X side.

The first pad 71 and second pad 72 are formed on the insulation layer 60. The first pad 71 is formed on the right side, i.e., on the +X side, and the second pad 72 is formed on the left side, i.e., on the −X side. The first pad 71 is electrically connected to the lower electrode 21 via the first via-hole 61. The second pad 72 is electrically connected to the upper electrode 42 via the second via-holes 62. To be more specific, the first pad 71 is electrically connected to an end portion of the lower electrode 21 on the right side, i.e., on the +X side, and the second pad 72 is electrically connected to an end portion of the upper electrode 42 on the left side, i.e., on the −X side.

Hereinafter, the influence by the presence/absence of the slit is described. The circuit element according to the present embodiment, which includes a slit, and a circuit element according to a comparative example, which does not include a slit, are compared and described. The circuit element according to the present embodiment and the circuit element according to the comparative example are different with respect to only the shape of the internal electrode in a projection onto the XY plane, and are the same with respect to the other structure. Hereinafter, for the purpose of convenience, the respective elements of the comparative example are described by applying the reference signs of the elements of the present embodiment.

Figure 3:
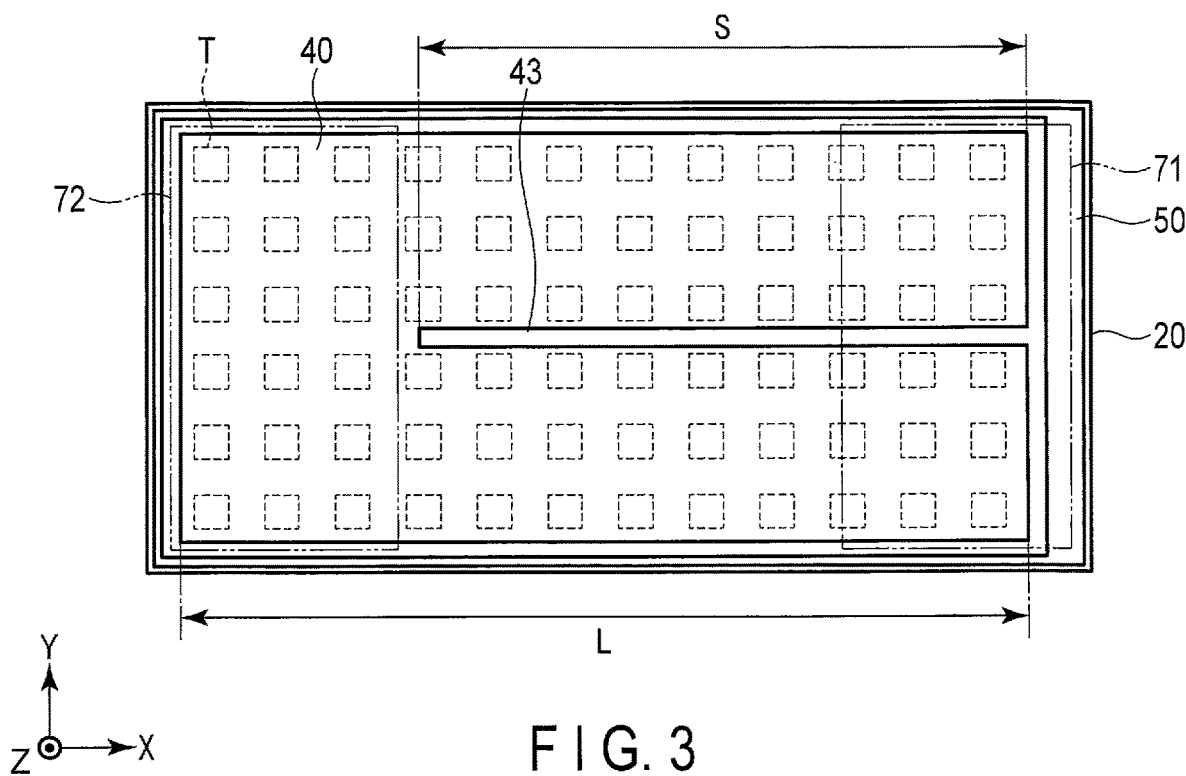
FIG. 3 is a plan view illustrating a shape of an internal electrode of the circuit element of FIG. 1.
Figure 4:
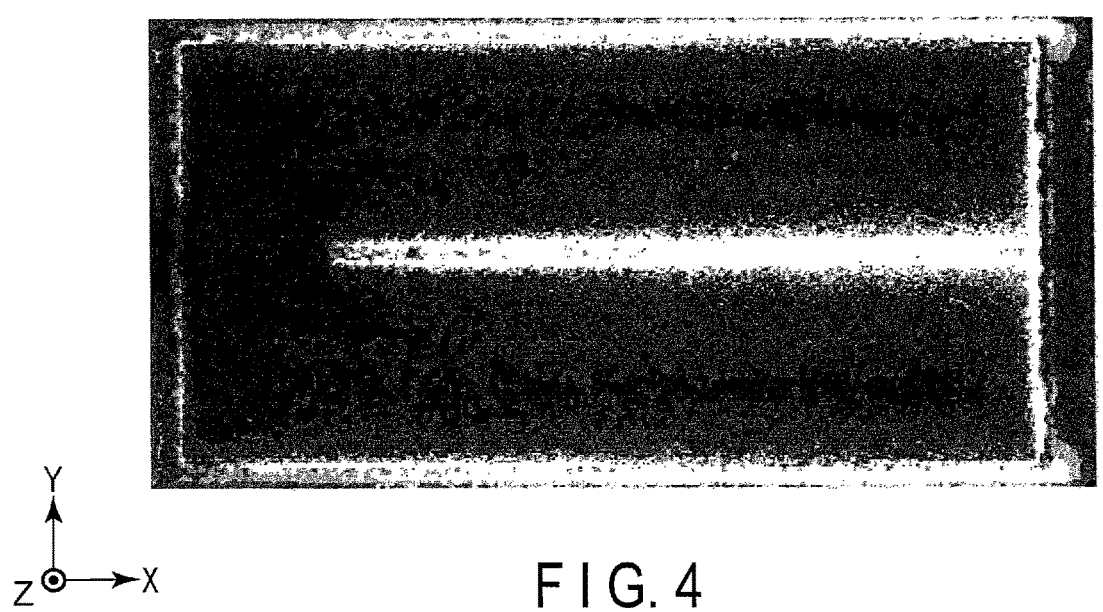
FIG. 4 is a view illustrating a current density distribution in a lower electrode of the circuit element including the internal electrode having the shape illustrated in FIG. 3.

FIG. 3 is a plan view illustrating the shape of the internal electrode 40 of the circuit element 10 according to the present embodiment. FIG. 4 is a view illustrating a current density distribution in the lower electrode 21 of the circuit element 10 including the internal electrode 40 of the shape illustrated in FIG. 3. FIG. 5 is a plan view illustrating a shape of an internal electrode 40 of a circuit element 10 according to a comparative example. FIG. 6 is a view illustrating a current density distribution in a lower electrode 21 of the circuit element 10 including the internal electrode 40 of the shape illustrated in FIG. 5.

As illustrated in FIG. 3, the internal electrode 40 of the circuit element 10 according to the present embodiment includes the slit 43. By contrast, as illustrated in FIG. 5, the internal electrode 40 of the circuit element 10 according to the comparative example includes no slit. In other words, it can be said that the circuit element 10 according to the present embodiment has a structure in which the slit 43 is provided in the internal electrode 40, compared to the circuit element 10 according to the comparative example.

In FIG. 4 and FIG. 6, the density in gray scale represents a high/low level of current density. A dark area represents an area of a low current density. A light area represents an area of a high current density. A blank area represents an area of a highest current density.

If FIG. 4 and FIG. 6 are compared, it is understood that in the circuit element 10 according to the comparative example, the current density is high, i.e., the flow of current is large, near the edge of the internal electrode 40, but the current density is low, i.e., the flow of current is small, near the center of the internal electrode 40.

On the other hand, in the circuit element 10 according to the present embodiment, it is understood that the current density is high, i.e., the flow of current is large, near the center of the internal electrode 40 where the slit 43 is present, as well as near the edge of the internal electrode 40. In addition, over the entirety of the lower electrode 21 of the circuit element 10, an area where the current density is low is small. In other words, current flows relatively uniformly in the entirety of the lower electrode 21 of the circuit element 10. It can be said that, compared to the comparative example, a current path of current flowing in the silicon substrate 20 is increased.

Next, referring to FIG. 7, a description is given of a difference in capacitance value of capacitors between the circuit element 10 according to the present embodiment and the circuit element 10 according to the comparative example. FIG. 7 is a graph showing frequency characteristics of electrostatic capacitance values of capacitors in the circuit element 10 according to the present embodiment and the circuit element 10 according to the comparative example. In the graph of FIG. 7, a solid line indicates the frequency characteristic of the capacitance value of the capacitor in the circuit element 10 according to the present embodiment, and a broken line indicates the frequency characteristic of the capacitance value of the capacitor in the circuit element 10 according to the comparative example.

From FIG. 7, the following is understood. In the circuit element 10 according to the comparative example, a decrease of the capacitance of the capacitor occurs in a high-frequency region near a self-resonance point of the capacitor. By contract, in the circuit element 10 according to the present embodiment, a decrease of the capacitance of the capacitor does not occur in a high-frequency region near a self-resonance point of the capacitor. That the decrease of the capacitance does not occur in the frequency characteristic of capacitance in this manner is a desirable characteristic for the capacitor.

Next, referring to FIG. 8, a description is given of a difference in impedance and equivalent series resistance of the capacitors in the circuit element according to the present embodiment and the circuit element according to the comparative example. FIG. 8 is a graph showing frequency characteristics of impedances and equivalent series resistances of the capacitors in the circuit element according to the present embodiment and the circuit element according to the comparative example. In the graph of FIG. 8, a solid line indicates the frequency characteristic of the impedance of the capacitor in the circuit element 10 according to the present embodiment, and a broken line indicates the frequency characteristic of the impedance of the capacitor in the circuit element 10 according to the comparative example. In addition, a black-circle dotted line indicates the frequency characteristic of the equivalent series resistance of the capacitor in the circuit element 10 according to the present embodiment, and a white-circle dotted line indicates the frequency characteristic of the equivalent series resistance of the capacitor in the circuit element 10 according to the comparative example.

In FIG. 8, it is understood that the equivalent series resistance of the capacitor in the circuit element 10 according to the present embodiment is lower than the equivalent series resistance of the capacitor in the circuit element 10 according to the comparative example, over all frequency regions. That the equivalent series resistance of the capacitor is low in this manner is a desired characteristic for the capacitor.

Referring back to FIG. 3, the details of the slit 43 of the internal electrode 40 are described. As illustrated in FIG. 3, the slit 43 extends from the center of the short side of the internal electrode 40, which is located on the side of the first pad 71 connected to the lower electrode 21, toward the side of the second pad 72 connected to the upper electrode 42. The slit 43 extends between a plurality of trenches T.

Figure 9:
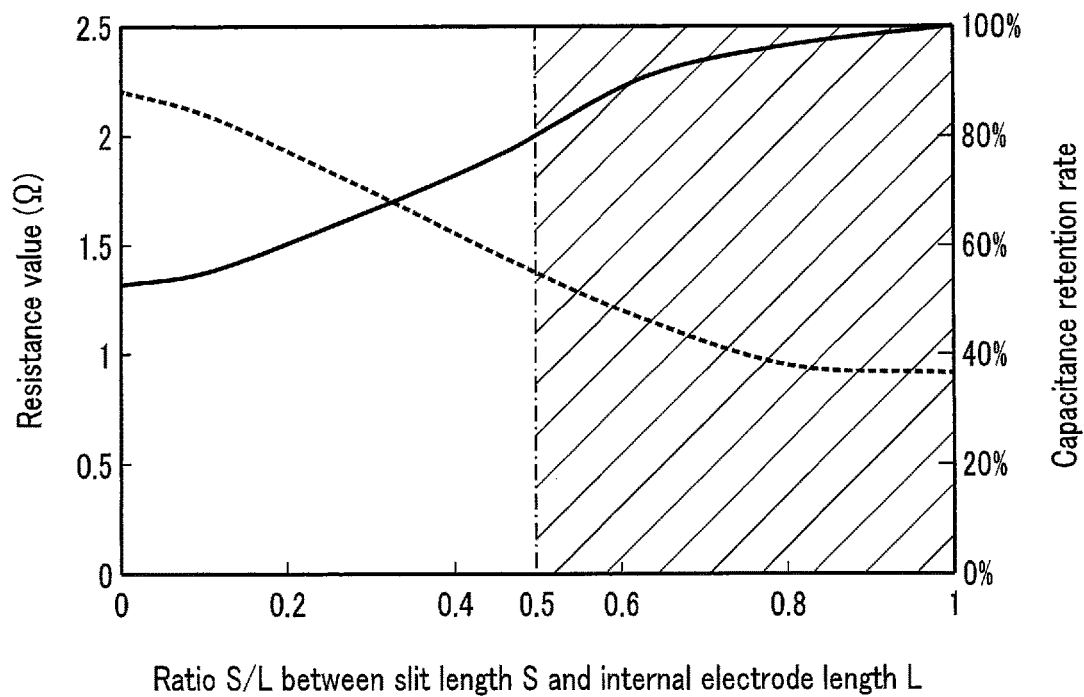
FIG. 9 is a graph showing characteristics of a capacity retention rate and an equivalent series resistance to the ratio between the length of a slit and the length of the internal electrode in the circuit element according to the first embodiment.

Next, a description is given of a length L of a side of the internal electrode 40, along which the slit 43 extends, and a length S of the slit 43. In the example of FIG. 3, the slit 43 extends along the long side of the internal electrode 40. Referring to FIG. 9, a description is given of characteristics of a capacity retention rate and an equivalent series resistance to a ratio S/L between the length S of the slit 43 and the length L of the long side of the internal electrode 40. FIG. 9 is a graph showing the characteristics of the capacity retention rate and equivalent series resistance to the ratio S/L. The graph of FIG. 9 indicates the equivalent series resistance of the circuit element 10 to the application of an AC voltage of 100 kHz, and the capacitance retention rate in a case where capacitance values of the circuit element 10 to the applications of AC voltages of 100 kHz and 30 MHz are compared. In the graph of FIG. 9, a solid line indicates the characteristic of the capacitance retention rate (the unit is indicated on the right side), and a broken line indicates the characteristic of the equivalent series resistance (the unit is indicated on the left side).

Note that S/L=0 means the length S of the slit 43=0. This corresponds to the structure in which the internal electrode 40 includes no slit, as in the comparative example illustrated in FIG. 5. In addition, S/L=1 means the length S of the slit 43=L. This corresponds to the structure in which the slit 43 extends over the entire length L of the long side of the internal electrode 40 and divides the internal electrode 40 into two. In other words, this corresponds to the structure in which, as in a second embodiment to be described later, the circuit element 10 includes two internal electrode 40 that are spaced apart from each other.

In the present embodiment, the ratio S/L between the length S of the slit 43 and the length L of the long side of the internal electrode 40 satisfies, for example, $0.5<S/L\leq1.0$. In the graph of FIG. 9, a range that satisfies $0.5<S/L\leq1.0$ is a range indicated by oblique lines. In this range, the capacitance retention rate is maintained at 80% or more. The capacitance retention rate of 80% is one standard as a preferable capacitor. In addition, the equivalent series resistance is reduced to less than 1.5Ω.

More preferably, the ratio S/L satisfies $0.6<S/L\leq1.0$. In this range, the capacitance retention rate is generally maintained at 90% or more. The capacitance retention rate of 90% is one standard as a more preferable capacitor. In addition, the equivalent series resistance is reduced to less than 1.25Ω.

As described above, in the circuit element 10 according to the present embodiment, the internal electrode 40 includes the slit 43. Thereby, compared to the circuit element 10 according to the comparative example, which does not include the slit, the high-frequency characteristics are improved. Specifically, the lowering of the capacitance in the high-frequency region is improved. Moreover, the equivalent series resistance is reduced.

<Modifications>

Hereinafter, modifications according to the present embodiment are described. Compared to the circuit element according to the structure example of FIG. 3, each of circuit elements according to the modifications is different with respect to only the shape of the internal electrode in a projection onto the XY plane, and is the same with respect to the other structure. Hereinafter, the respective elements of the modifications are described by applying the reference signs of the elements of the structure example of FIG. 3.

(Modification 1)

Figure 10:
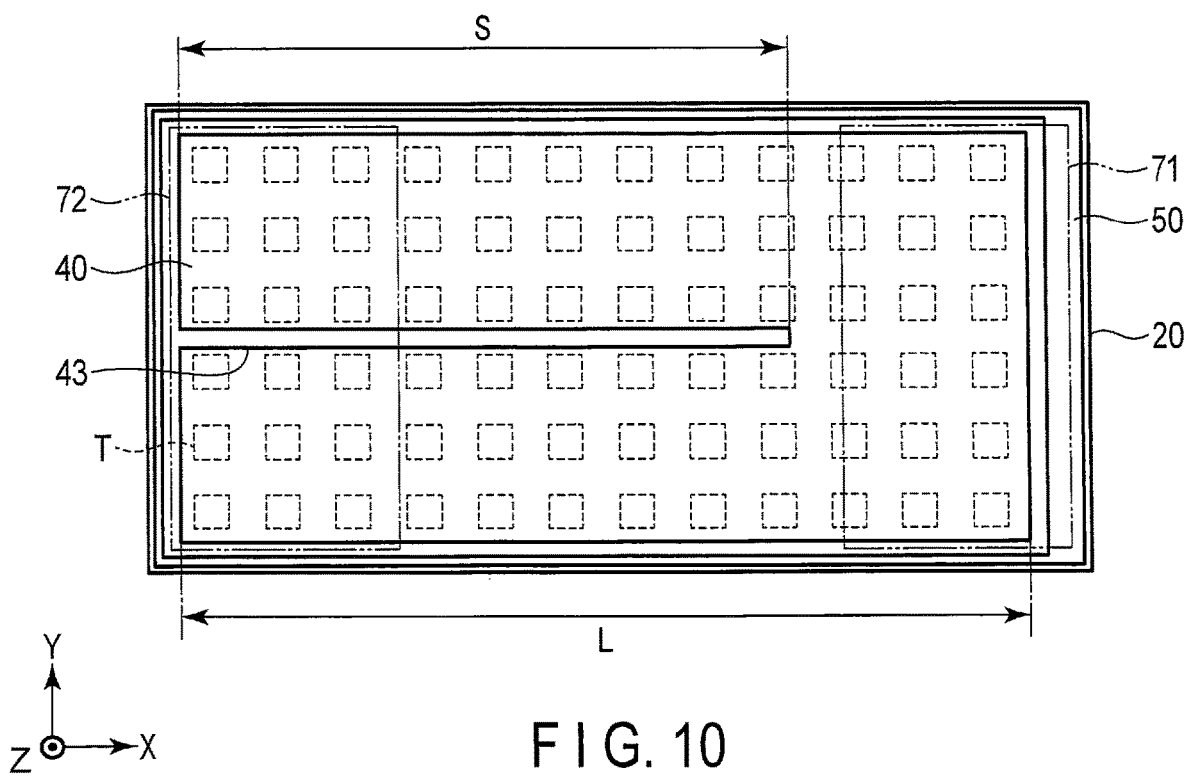
FIG. 10 is a plan view illustrating a shape of an internal electrode of a circuit element according to Modification 1 of the first embodiment.

To begin with, referring to FIG. 10, a circuit element 10 according to Modification 1 is described. FIG. 10 is a plan view illustrating a shape of an internal electrode 40 of the circuit element 10 according to Modification 1.

In the circuit element 10 according to Modification 1, the internal electrode 40 includes one elongated rectangular slit 43. The slit 43 extends from the center of the short side of the internal electrode 40, which is located on the side of the second pad 72 connected to the upper electrode 42, toward the side of the first pad 71 connected to the lower electrode 21. Specifically, the slit 43 extends along the long side of the internal electrode 40. The slit 43 extends between a plurality of trenches T. In addition, the ratio S/L between the length S of the slit 43 and the length L of the long side of the internal electrode 40 satisfies $0.5<S/L\leq1.0$. More preferably, the ratio S/L satisfies $0.6<S/L\leq1.0$.

In the circuit element 10 according to Modification 1, like the circuit element 10 according to the structure example of FIG. 3, the lowering of the capacitance in the high-frequency region is improved. Moreover, the equivalent series resistance is reduced.

(Modification 2)

Figure 11:
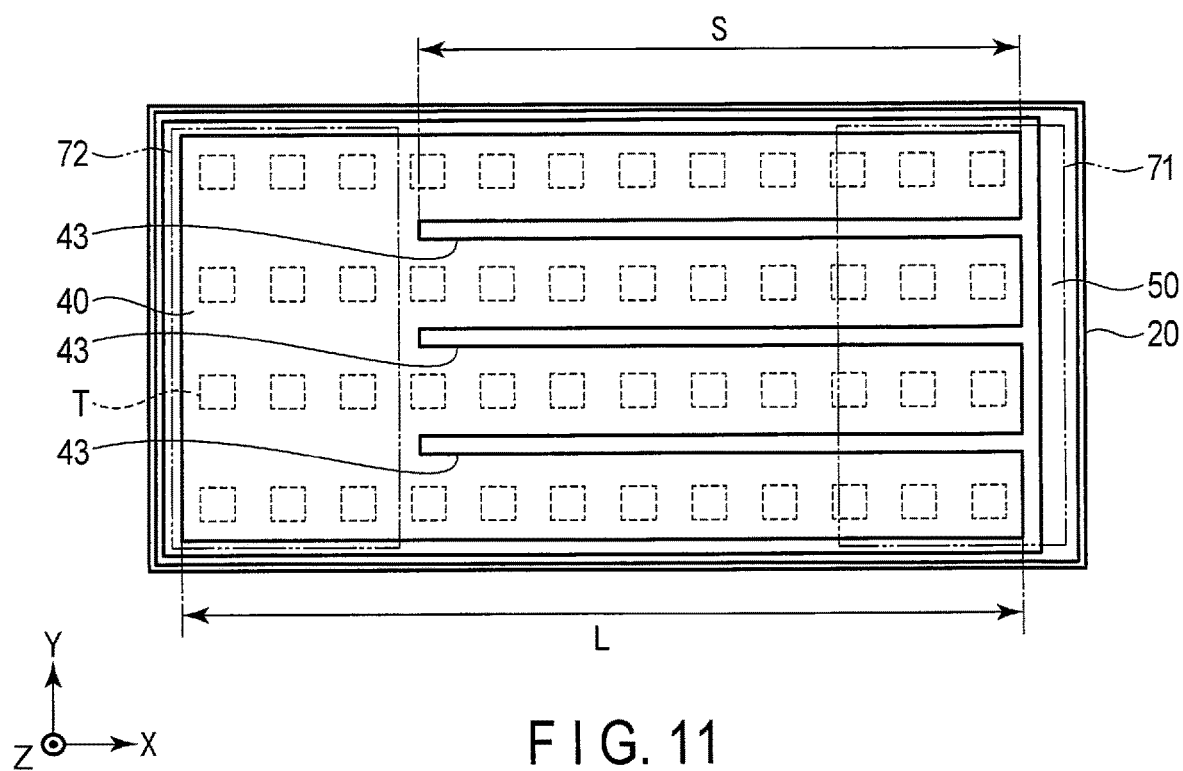
FIG. 11 is a plan view illustrating a shape of an internal electrode of a circuit element according to Modification 2 of the first embodiment.

Next, referring to FIG. 11, a circuit element 10 according to Modification 2 is described. FIG. 11 is a plan view illustrating a shape of an internal electrode 40 of the circuit element 10 according to Modification 2.

In the circuit element 10 according to Modification 2, the internal electrode 40 includes three elongated rectangular slits 43. The three slits 43 extend from a short side of the internal electrode 40, which is located on the side of the first pad 71 connected to the lower electrode 21, toward the side of the second pad 72 connected to the upper electrode 42. Specifically, the three slits 43 extend along the long side of the internal electrode 40. The three slits 43 extend in parallel to each other. Each of the three slits 43 extends between a plurality of trenches T. The three slits 43 have the same shape, and the lengths S of the three slits 43 are equal. The ratio S/L between the length S of the slit 43 and the length L of the long side of the internal electrode 40 satisfies $0.5<S/L\leq1.0$. More preferably, the ratio S/L satisfies $0.6<S/L\leq1.0$.

In the circuit element 10 according to Modification 2, since the internal electrode 40 includes the three slits 43, a further increase of the current path of current flowing in the silicon substrate 20 can be expected, compared to the circuit element 10 according to the structure example of FIG. 3, in which the internal electrode 40 includes one slit 43. Thereby, a further improvement in regard to the lowering of the capacitance in the high-frequency region can be expected. Moreover, a further reduction of the equivalent series resistance can be expected.

Here, although the lengths S of the three slits 43 are described as being equal, the lengths S of the three slits 43 may be different. In this case, for example, it is preferable that the length S of the longest slit 43 satisfies $0.5<S/L\leq1.0$. It is more preferable that the length S of the shortest slit 43 satisfies 0.5<S/L≤1.0. Besides, the number of slits 43 is not limited to three, and may be two, or four or more.

(Modification 3)

Figure 12:
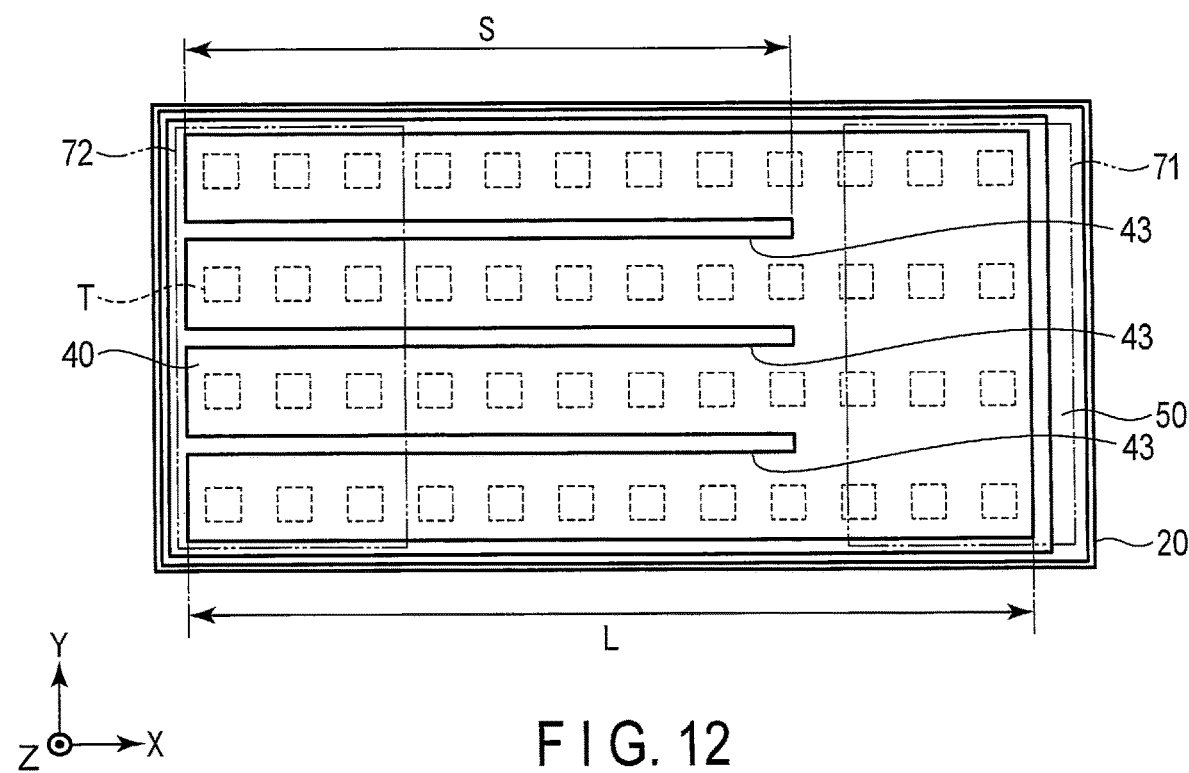
FIG. 12 is a plan view illustrating a shape of an internal electrode of a circuit element according to Modification 3 of the first embodiment.

Next, referring to FIG. 12, a circuit element 10 according to Modification 3 is described. FIG. 12 is a plan view illustrating a shape of an internal electrode 40 of the circuit element 10 according to Modification 3.

In the circuit element 10 according to Modification 3, the internal electrode 40 includes three elongated rectangular slits 43. The three slits 43 extend from a short side of the internal electrode 40, which is located on the side of the second pad 72 connected to the upper electrode 42, toward the side of the first pad 71 connected to the lower electrode 21. Specifically, the three slits 43 extend along the long side of the internal electrode 40. The three slits 43 extend in parallel to each other. Each of the three slits 43 extends between a plurality of trenches T. The three slits 43 have the same shape, and the lengths S of the three slits 43 are equal. The ratio S/L between the length S of the slit 43 and the length L of the long side of the internal electrode 40 satisfies 0.5<S/L≤1.0. More preferably, the ratio S/L satisfies 0.6<S/L≤1.0.

In the circuit element 10 according to Modification 3, since the internal electrode 40 includes the three slits 43, a further increase of the current path of current flowing in the silicon substrate 20 can be expected, like Modification 2, compared to the circuit element 10 according to the structure example of FIG. 3. Thereby, a further improvement in regard to the lowering of the capacitance in the high-frequency region can be expected. Moreover, a further reduction of the equivalent series resistance can be expected.

In Modification 3, like Modification 2, the lengths S of the three slits 43 may be different. Besides, the number of slits 43 may be two, or four or more.

(Modification 4)

Next, referring to FIG. 13, a circuit element 10 according to Modification 4 is described. FIG. 13 is a plan view illustrating a shape of an internal electrode 40 of the circuit element 10 according to Modification 4.

In the circuit element 10 according to Modification 4, the internal electrode 40 includes a pair of elongated rectangular slits 43. The pair of slits 43 extend from a pair of short sides of the internal electrode 40 toward the center. Specifically, the pair of slits 43 extends along the long side of the internal electrode 40. The pair of slits 43 extends on an identical straight line. Further, the pair of slits 43 passes through the center of the outer shape of the internal electrode 40. Each of the pair of slits 43 extends between a plurality of trenches T. The ratio S/L between a sum S of lengths S1 and S2 of the pair of slits 43 and the length L of the long side of the internal electrode 40 satisfies 0.5<S/L≤1.0. More preferably, the ratio S/L satisfies 0.6<S/L≤1.0. The lengths S1 and S2 of the pair of slits 43 may be equal or may be different.

In the circuit element 10 according to Modification 4, like the circuit element 10 according to the structure example of FIG. 3, the lowering of the capacitance in the high-frequency region is improved. Moreover, the equivalent series resistance is reduced.

(Modification 5)

Next, referring to FIG. 14, a circuit element 10 according to Modification 5 is described. FIG. 14 is a plan view illustrating a shape of an internal electrode 40 of the circuit element 10 according to Modification 5.

In the circuit element 10 according to Modification 5, the internal electrode 40 includes three pairs of slits 43. The three pairs of slits 43 extend from a pair of short sides of the internal electrode 40 toward the center. Specifically, the three pairs of slits 43 extend along the long side of the internal electrode 40. Each pair of slits 43 extends on an identical straight line. The three pairs of slits 43 extend in parallel to each other. Each of the three pairs of slits 43 extends between a plurality of trenches T. The ratio S/L between a sum S of lengths S1 and S2 of each pair of slits 43 and the length L of the long side of the internal electrode 40 satisfies 0.5<S/L≤1.0. More preferably, the ratio S/L satisfies 0.6<S/L≤1.0. The lengths S1 and S2 of each pair of slits 43 may be equal or may be different.

In the circuit element 10 according to Modification 5, since the internal electrode 40 includes the three pairs of slits 43, a further increase of the current path of current flowing in the silicon substrate 20 can be expected, compared to the circuit element 10 according to the structure example of FIG. 3. Thereby, a further improvement in regard to the lowering of the capacitance in the high-frequency region can be expected. Moreover, a further reduction of the equivalent series resistance can be expected.

In the circuit element 10 according to Modification 5, the number of pairs of slits 43 is not limited to three pairs, and may be two pairs, or four or more pairs.

(Modification 6)

Next, referring to FIG. 15, a circuit element 10 according to Modification 6 is described. FIG. 15 is a plan view illustrating a shape of an internal electrode 40 of the circuit element 10 according to Modification 6.

In the circuit element 10 according to Modification 6, the internal electrode 40 includes three elongated rectangular slits 43. The three slits 43 extend from a long side of the internal electrode 40, which is located on the front side, i.e., −Y side, toward the rear side, i.e., +Y side. Specifically, the three slits 43 extend along the short side of the internal electrode 40. The three slits 43 extend in parallel to each other. Each of the three slits 43 extends between a plurality of trenches T. The three slits 43 have the same shape, and the lengths S of the three slits 43 are equal. The ratio S/L between the length S of the slit 43 and the length L of the short side of the internal electrode 40 satisfies 0.5<S/L≤1.0. More preferably, the ratio S/L satisfies 0.6<S/L≤1.0.

In the circuit element 10 according to Modification 6, since the internal electrode 40 includes the three slits 43, a further increase of the current path of current flowing in the silicon substrate 20 can be expected, compared to the circuit element 10 according to the structure example of FIG. 3. Thereby, a further improvement in regard to the lowering of the capacitance in the high-frequency region can be expected. Moreover, a further reduction of the equivalent series resistance can be expected.

Here, although the lengths S of the three slits 43 are described as being equal, the lengths S of the three slits 43 may be different. In this case, for example, it is preferable that the length S of the longest slit 43 satisfies 0.5<S/L≤1.0. It is more preferable that the length S of the shortest slit 43 satisfies 0.5<S/L≤1.0. Besides, the number of slits 43 is not limited to three, and may be one, two, or four or more.

(Modification 7)

Next, referring to FIG. 16, a circuit element 10 according to Modification 7 is described. FIG. 16 is a plan view illustrating a shape of an internal electrode 40 of the circuit element 10 according to Modification 7.

In the circuit element 10 according to Modification 7, the internal electrode 40 includes three pairs of elongated rectangular slits 43. The three pairs of slits 43 extend from a pair of long sides of the internal electrode 40 toward the center. Specifically, the three pairs of slits 43 extend along the short side of the internal electrode 40. Each pair of slits 43 extends on an identical straight line. The three pairs of slits 43 extend in parallel to each other. Each of the three pairs of slits 43 extends between a plurality of trenches T. The ratio S/L between a sum S of lengths S1 and S2 of each pair of slits 43 and the length L of the short side of the internal electrode 40 satisfies $0.5 < S/L \leq 1.0$. More preferably, the ratio S/L satisfies $0.6 < S/L \leq 1.0$. The lengths S1 and S2 of each pair of slits 43 may be equal or may be different.

In the circuit element 10 according to Modification 7, since the internal electrode 40 includes the three pairs of slits 43, a further increase of the current path of current flowing in the silicon substrate 20 can be expected, compared to the circuit element 10 according to the structure example of FIG. 3. Thereby, a further improvement in regard to the lowering of the capacitance in the high-frequency region can be expected. Moreover, a further reduction of the equivalent series resistance can be expected.

In the circuit element 10 according to Modification 7, the number of pairs of slits 43 is not limited to three pairs, and may be one pair, two pairs, or four or more pairs.

(Modification 8)

Figure 17:
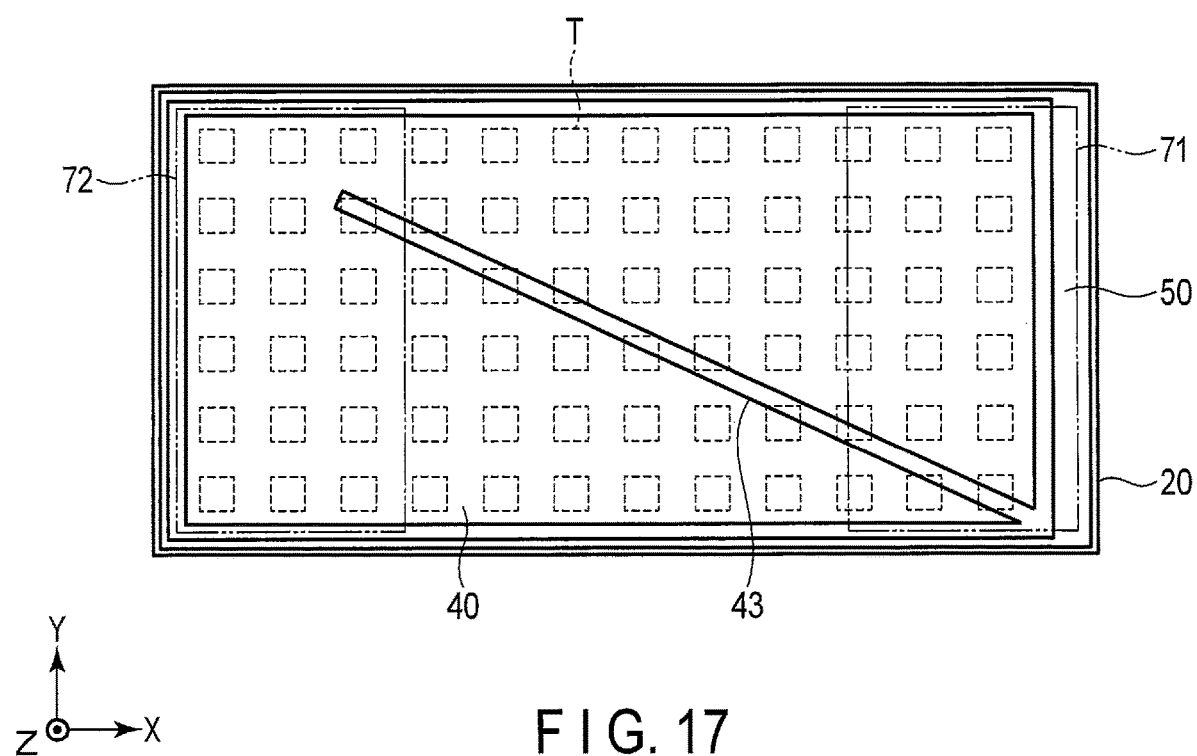
FIG. 17 is a plan view illustrating a shape of an internal electrode of a circuit element according to Modification 8 of the first embodiment.

To begin with, referring to FIG. 17, a circuit element 10 according to Modification 8 is described. FIG. 17 is a plan view illustrating a shape of an internal electrode 40 of the circuit element 10 according to Modification 8.

In the circuit element 10 according to Modification 8, the internal electrode 40 includes one elongated rectangular slit 43. The slit 43 extends obliquely from one corner of the internal electrode 40, which is located on the side where the first pad 71 is located. Specifically, the slit 43 extends obliquely from one corner on the right side and on the front side, i.e., on the +X side and on the −Y side. For example, the slit 43 extends on a diagonal of the outer shape, i.e., the rectangular shape, of the internal electrode 40.

In the circuit element 10 according to Modification 8, like the circuit element 10 according to the structure example of FIG. 3, the lowering of the capacitance in the high-frequency region is improved. Moreover, the equivalent series resistance is reduced.

In the circuit element 10 according to Modification 8, the slit 43 may extend obliquely from one corner of the internal electrode 40, which is located on the side where the second pad 72 is located.

Second Embodiment

Figure 18:
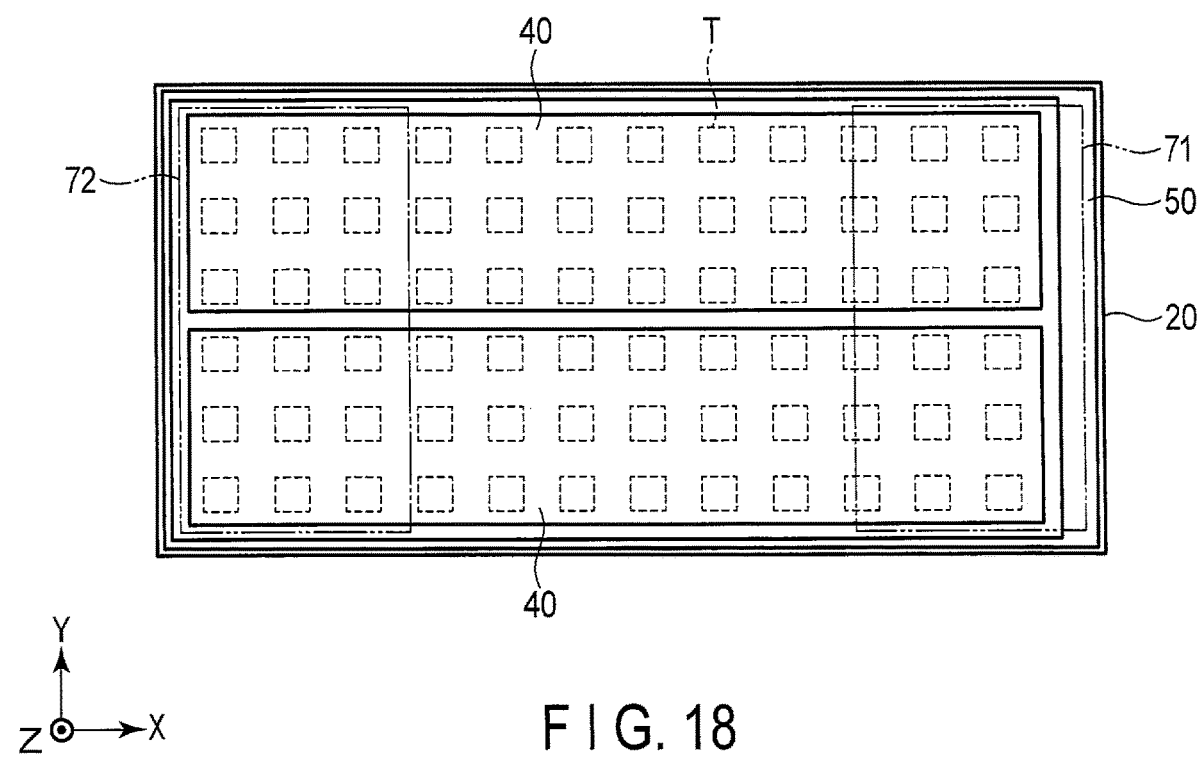
FIG. 18 is a plan view illustrating a shape of an internal electrode of a circuit element according to a second embodiment.

Referring to FIG. 18, a circuit element according to a second embodiment is described. FIG. 18 is a plan view illustrating a shape of an internal electrode 40 of a circuit element 10 according to the second embodiment. The structure of the circuit element 10 according to the present embodiment is the same as the structure of the circuit element 10 according to the first embodiment, excluding the shape of the internal electrode 40. Hereinafter, the respective elements of the circuit element 10 according to the present embodiment are described by applying the reference signs of the elements of the circuit element 10 according to the first embodiment.

The circuit element 10 according to the present embodiment includes two internal electrodes 40. Each of the shapes of the two internal electrodes 40 is a rectangular shape with a long side extending in the left-and-right direction, i.e., along the X axis. Mutually neighboring long sides of the two internal electrodes 40 are parallel to each other and are spaced apart from each other. The two internal electrodes 40 are located above a plurality of trenches T. Specifically, a gap between the two internal electrodes 40 extends between a plurality of trenches T.

In other words, it can be said that the circuit element 10 according to the present embodiment has such a structure that in the circuit element 10 according to the first embodiment, the slit 43 is extended over the entire length L of the long side of the internal electrode 40, thereby dividing the internal electrode 40 into two.

Figure 19:
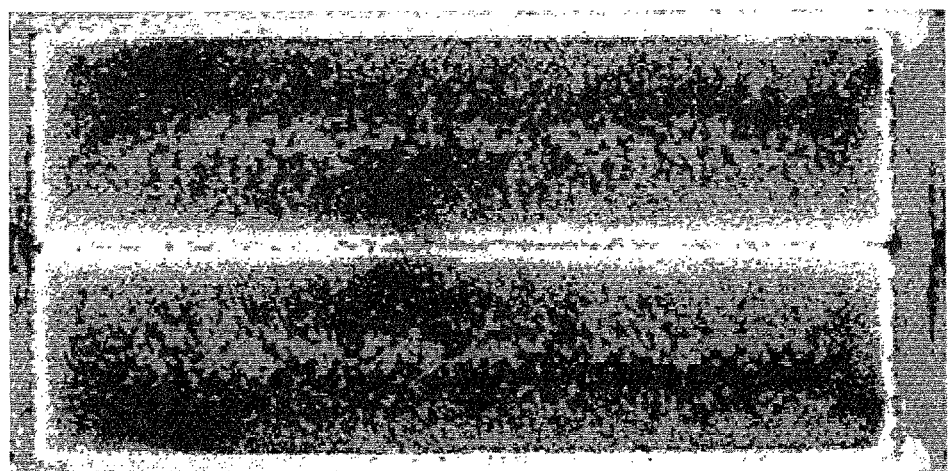
FIG. 19 is a view illustrating a current density distribution in a lower electrode of the circuit element according to the second embodiment.

FIG. 19 is a view illustrating a current density distribution in the lower electrode 21 of the circuit element 10 according to the present embodiment. In FIG. 19, the density in gray scale represents a high/low level of current density. A dark area represents an area of a low current density. A light area represents an area of a high current density. A blank area represents an area of a highest current density.

In the circuit element 10 according to the present embodiment, the current density is high, i.e., the flow of current is large, near the edge of the internal electrode 40. In addition, over the entirety of the lower electrode 21 of the circuit element 10, an area where the current density is low is small. In other words, current flows relatively uniformly in the entirety of the lower electrode 21 of the circuit element 10. It can be said that, compared to the comparative example described with reference to FIG. 5 and FIG. 6, the current path of current flowing in the silicon substrate 20 is increased.

As described above, the circuit element 10 according to the present embodiment includes the two internal electrodes 40 that are spaced apart from each other. Thereby, compared to the circuit element 10 according to the comparative example, which includes a single internal electrode 40, the high-frequency characteristics are improved. Specifically, the lowering of the capacitance in the high-frequency region is improved. Moreover, the equivalent series resistance is reduced.

(Modification)

Figure 20:
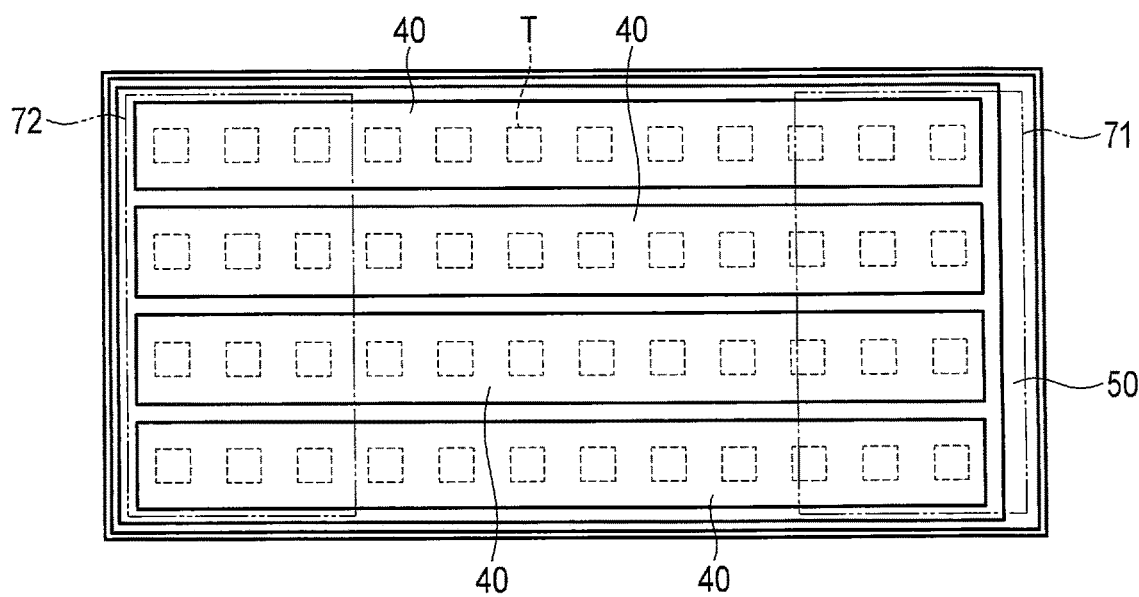
FIG. 20 is a plan view illustrating a shape of an internal electrode of a circuit element according to a modification of the second embodiment.

Referring to FIG. 20, a circuit element 10 according to a modification of the present embodiment is described. FIG. 20 is a plan view illustrating a shape of an internal electrode 40 of the circuit element 10 according to the modification of the present embodiment.

The circuit element 10 according to the modification includes four internal electrodes 40. Each of the four internal electrodes 40 has a rectangular shape with a long side extending in the left-and-right direction, i.e., along the X axis. Mutually neighboring long sides of the four internal electrodes 40 are parallel to each other and are spaced apart from each other. The four internal electrodes 40 are located above a plurality of trenches T. Specifically, gaps between the four internal electrodes 40 extend between a plurality of trenches T.

The circuit element 10 according to the present modification includes the four internal electrodes 40. Thus, a further increase of the current path of current flowing in the silicon substrate 20 can be expected, compared to the circuit element 10 according to the structure example of FIG. 18, which includes the two internal electrodes 40. Thereby, a further improvement in regard to the lowering of the capacitance in the high-frequency region can be expected. Moreover, a further reduction of the equivalent series resistance can be expected.

The number of internal electrodes 40 is not limited to four, and may be three, or five or more.

According to the above-described embodiments, circuit elements with improved high-frequency characteristics are provided. Specifically, a circuit element is provided in which the lowering of capacitance in the high-frequency region is decreased. Furthermore, a circuit element is provided which includes a capacitor with a low equivalent series resistance value.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A circuit element comprising:
    a silicon substrate;
    a lower electrode formed on a major surface of the silicon substrate by a doping process;
    a dielectric film formed on the lower electrode;
    an upper electrode formed on the dielectric film, the upper electrode including a slit;
    a first pad electrically connected to the lower electrode; and
    a second pad electrically connected to the upper electrode,
    wherein an outer shape of the upper electrode is a rectangular shape with a long side extending between the first pad and the second pad.

2. The circuit element of claim 1, wherein the slit extends along a side of the upper electrode.

3. The circuit element of claim 2, wherein a length L of the side of the upper electrode, along which the slit extends, and a length S of the slit satisfy $0.5 < S/L \leq 1.0$.

4. The circuit element of claim 2, wherein the slit extends along a long side of the upper electrode.

5. The circuit element of claim 2, wherein the slit extends along a short side of the upper electrode.

6. The circuit element of claim 1, wherein the slit extends obliquely to a side of the upper electrode.

7. The circuit element of claim 1, wherein
    the silicon substrate, the lower electrode and the dielectric film include a plurality of trenches, and
    the circuit element further comprises a conductive layer that is interposed between the dielectric film and the upper electrode and fills the trenches.

8. The circuit element of claim 7, wherein the slit extends between the trenches.

9. The circuit element of claim 1, wherein the upper electrode includes a plurality of slits extending along a side of the upper electrode.

10. The circuit element of claim 1, wherein the upper electrode includes a pair of slits extending from opposed sides of the upper electrode.

11. The circuit element of claim 10, wherein a length L of a side of the upper electrode, along which the slits extend, and a sum S of lengths of the pair of slits satisfy $0.5 < S/L \leq 1.0$.

12. The circuit element of claim 10, wherein the pair of slits extends on an identical straight line.

13. The circuit element of claim 10, wherein the pair of slits extends along a long side of the upper electrode.

14. The circuit element of claim 10, wherein the pair of slits extends along a short side of the upper electrode.

15. The circuit element of claim 10, wherein the upper electrode includes a plurality of pairs of slits extending from opposed sides of the upper electrode.

16. A circuit element comprising:
    a silicon substrate;
    a lower electrode formed on a major surface of the silicon substrate by a doping process;
    a dielectric film formed on the lower electrode; and
    a plurality of upper electrodes formed on the dielectric film, the upper electrodes being spaced apart from each other;
    a first pad electrically connected to the lower electrode; and
    a second pad electrically connected to the upper electrodes,
    wherein a shape of each of the upper electrodes is a rectangular shape with a long side extending between the first pad and the second pad.

17. The circuit element of claim 16, wherein
    the silicon substrate, the lower electrode and the dielectric film include a plurality of trenches, and
    the circuit element further comprises a conductive layer that is interposed between the dielectric film and the upper electrodes and fills the trenches.

18. The circuit element of claim 17, wherein the upper electrodes are located above the trenches.

* * * * *